(12) United States Patent
Nagami

(10) Patent No.: US 11,887,817 B2
(45) Date of Patent: Jan. 30, 2024

(54) PLASMA PROCESSING APPARATUS AND PLASMA PROCESSING METHOD

(71) Applicant: Tokyo Electron Limited, Tokyo (JP)

(72) Inventor: Koichi Nagami, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/232,231

(22) Filed: Apr. 16, 2021

(65) Prior Publication Data

US 2021/0335578 A1    Oct. 28, 2021

(30) Foreign Application Priority Data

Apr. 28, 2020  (JP) ................................ 2020-079517
Mar. 5, 2021   (JP) ................................ 2021-035192

(51) Int. Cl.
*H01J 37/32*    (2006.01)

(52) U.S. Cl.
CPC .. *H01J 37/32422* (2013.01); *H01J 37/32137* (2013.01); *H01J 37/32266* (2013.01); *H01J 37/32715* (2013.01); *H01J 2237/334* (2013.01)

(58) Field of Classification Search
CPC ........... H01J 37/32422; H01J 37/32137; H01J 37/32266
See application file for complete search history.

(56) References Cited

U.S. PATENT DOCUMENTS

| | | | |
|---|---|---|---|
| 2008/0210973 A1* | 9/2008 | Chen ....................... | H01L 33/32 438/45 |
| 2009/0001890 A1* | 1/2009 | Singh ................ | H01J 37/32412 315/111.21 |
| 2009/0194508 A1 | 8/2009 | Ul et al. | |
| 2010/0025821 A1* | 2/2010 | Ohmi ................ | H01J 37/32706 438/513 |
| 2010/0285237 A1* | 11/2010 | Ditizio .................... | C23C 16/34 977/891 |
| 2011/0014778 A1* | 1/2011 | Klepper .................. | C23C 14/16 438/469 |
| 2012/0145918 A1* | 6/2012 | Radovanov ....... | H01J 37/32357 250/424 |
| 2013/0052833 A1* | 2/2013 | Ranjan ................ | H01L 21/3065 438/714 |
| 2014/0106571 A1* | 4/2014 | Koo ................... | H01J 37/32862 438/758 |
| 2014/0272182 A1* | 9/2014 | Koo ................... | H01J 37/32146 427/523 |

FOREIGN PATENT DOCUMENTS

| | | |
|---|---|---|
| JP | 2009-187975 A | 8/2009 |
| JP | 2012-104382 A | 5/2012 |

\* cited by examiner

*Primary Examiner* — Keath T Chen
(74) *Attorney, Agent, or Firm* — Studebaker & Brackett PC

(57) ABSTRACT

The disclosed plasma processing apparatus is provided with a chamber, a substrate support, and a power source system. The substrate support has an electrode and configured to support a substrate in the chamber. The power source system is electrically connected to the electrode and configured to apply a bias voltage to the electrode to draw ions from a plasma in the chamber into the substrate on the substrate support. The power source system is configured to output a first pulse to the electrode in a first period and output a second pulse to the electrode in a second period after the first period, as the bias voltage. Each of the first pulse and the second pulse is a pulse of a voltage. A voltage level of the first pulse is different from a voltage level of the second pulse.

13 Claims, 9 Drawing Sheets

PLASMA PROCESSING APPARATUS AND PLASMA PROCESSING METHOD

CROSS-REFERENCE TO RELATED APPLICATIONS

This application is based on and claims the benefit of priority from Japanese Patent Application Nos. 2020-079517, filed on Apr. 28, 2020, and 2021-035192, filed on Mar. 5, 2021, the entire contents of which are incorporated herein by reference.

FIELD

Exemplary embodiments of the present disclosure relate to a plasma processing apparatus and a plasma processing method.

BACKGROUND

A plasma processing apparatus is used in plasma processing on a substrate. The plasma processing apparatus is provided with a chamber and a substrate holding electrode. The substrate holding electrode is provided in the chamber. The substrate holding electrode holds the substrate placed on the principal surface thereof. A type of such plasma processing apparatus is disclosed in Japanese Unexamined Patent Publication No. 2009-187975.

The plasma processing apparatus disclosed in Japanese Unexamined Patent Publication No. 2009-187975 is further provided with a radio frequency generation device and a DC negative pulse generation device. The radio frequency generation device applies a radio frequency voltage to the substrate holding electrode. In the plasma processing apparatus disclosed in Japanese Unexamined Patent Publication No. 2009-187975, the radio frequency voltage is switched on and off alternately. Further, in the plasma processing apparatus disclosed in Japanese Unexamined Patent Publication No. 2009-187975, a DC negative pulse voltage is applied from the DC negative pulse generation device to the substrate holding electrode according to an on/off timing of the radio frequency voltage.

SUMMARY

In an exemplary embodiment, a plasma processing apparatus is provided. The plasma processing apparatus is provided with a chamber, a substrate support, and a power source system. The substrate support has an electrode and configured to support a substrate in the chamber. The power source system is electrically connected to the electrode and configured to apply a bias voltage to the electrode to draw ions from a plasma in the chamber into the substrate on the substrate support. The power source system is configured to output a first pulse to the electrode in a first period and output a second pulse to the electrode in a second period after the first period, as the bias voltage. Each of the first pulse and the second pulse is a pulse of a voltage. A voltage level of the first pulse is different from a voltage level of the second pulse.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
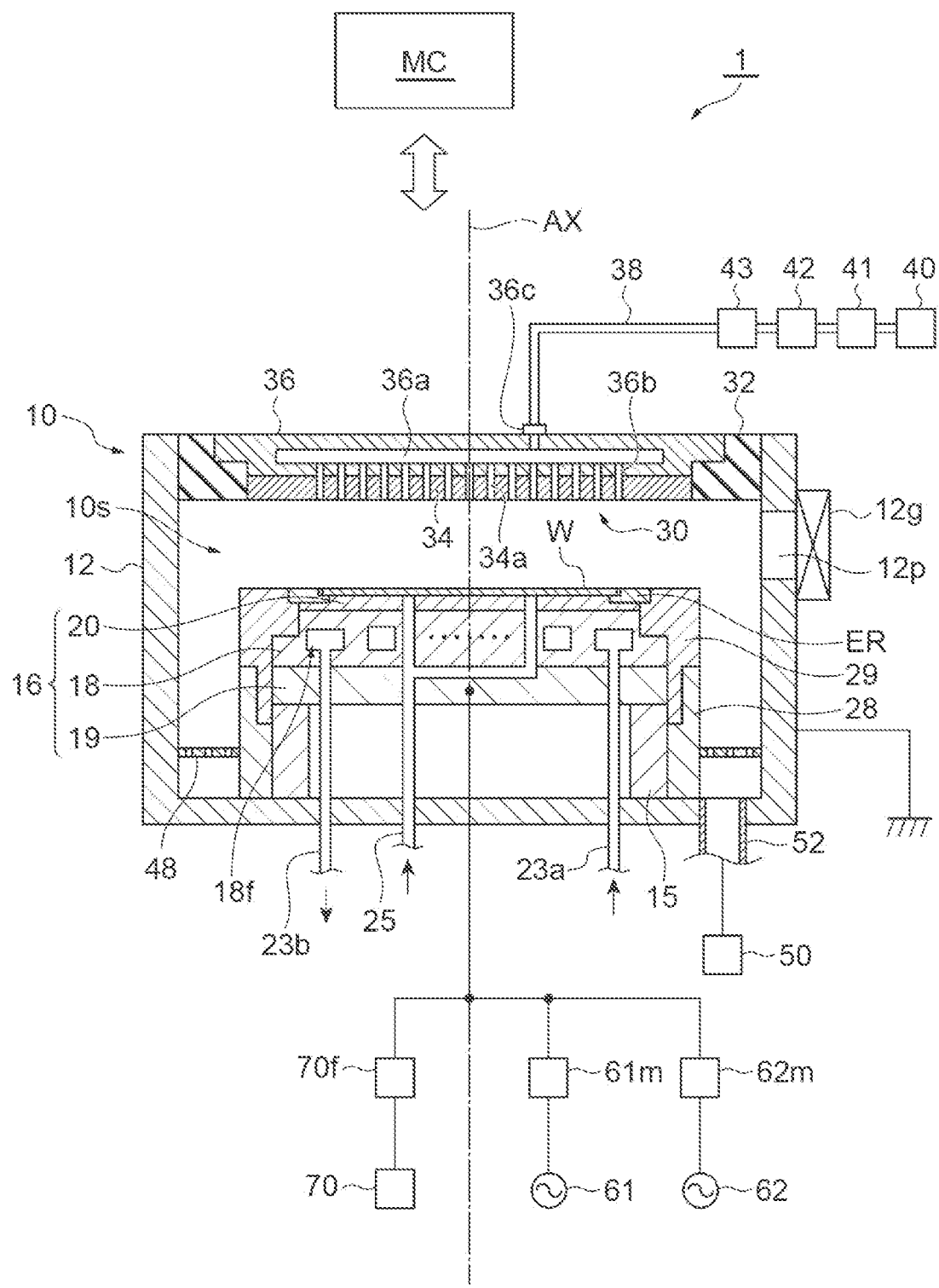
FIG. 1 schematically illustrates a plasma processing apparatus according to an exemplary embodiment.

Hereinafter, various exemplary embodiments will be described.

In an exemplary embodiment, a plasma processing apparatus is provided. The plasma processing apparatus is provided with a chamber, a substrate support, and a power source system. The substrate support has an electrode and configured to support a substrate in the chamber. The power source system is electrically connected to the electrode and configured to apply a bias voltage to the electrode to draw ions from a plasma in the chamber into the substrate on the substrate support. The power source system is configured to output a first pulse to the electrode in a first period and output a second pulse to the electrode in a second period after the first period, as the bias voltage. Each of the first pulse and the second pulse is a pulse of a voltage. A voltage level of the first pulse is different from a voltage level of the second pulse.

In the aforementioned embodiment, the voltage level of the first pulse is different from the voltage level of the second pulse. Therefore, energy of ions supplied from the plasma to the substrate in the first period is different from energy of ions supplied from the plasma to the substrate in the second period. Hence, according to the aforementioned embodiment, it is possible to supply ions having different energies to the substrate.

In an exemplary embodiment, the second period may be continuous with the first period. Each of the first pulse and the second pulse may be a pulse of a negative voltage. An absolute value of the voltage level of the first pulse may be smaller than an absolute value of the voltage level of the second pulse.

In an exemplary embodiment, each of the first pulse and the second pulse may be a pulse of a negative voltage. An absolute value of the voltage level of the first pulse may be larger than an absolute value of the voltage level of the second pulse. The power source system may be configured such that an output voltage to the electrode is 0 V in a period between the first period and the second period.

In an exemplary embodiment, the second period may be continuous with the first period. Each of the first pulse and the second pulse may be a pulse of a negative voltage. An absolute value of the voltage level of the first pulse may be larger than an absolute value of the voltage level of the second pulse.

In an exemplary embodiment, the power source system may be configured to output a third pulse to the electrode in a third period after the second period. The third pulse may be a pulse of a negative voltage. An absolute value of a voltage level of the third pulse may be larger than the absolute value of the voltage level of the second pulse.

In an exemplary embodiment, each of the first pulse and the second pulse may be a pulse of a negative voltage. The power source system may be configured to output a pulse of a positive voltage to the electrode before start of the first period within a subsequent cycle of two cycles, each of which includes the first period and the second period. According to the embodiment, electrons are supplied to the substrate when the pulse of the positive voltage is supplied to the electrode of the substrate support. As a result, the amount of positive charges of the substrate is reduced.

In an exemplary embodiment, the power source system may be configured to intermittently output the first pulse to the electrode in the first period. The power source system may be configured to intermittently output the second pulse to the electrode in the second period.

In an exemplary embodiment, each of the first pulse and the second pulse may be a pulse of a negative voltage. The power source system may be configured to alternately output the first pulse and a pulse of a positive voltage to the electrode in the first period. The power source system may be configured to alternately output the second pulse and a pulse of a positive voltage to the electrode in the second period. According to the embodiment, electrons are supplied to the substrate when the pulse of the positive voltage is supplied to the electrode of the substrate support. As a result, the amount of positive charges of the substrate is reduced.

In an exemplary embodiment, the power source system may be configured to output a pulse of a positive voltage to the electrode in a period between the first period and the second period. According to the embodiment, electrons are supplied to the substrate when the pulse of the positive voltage is supplied to the electrode of the substrate support. As a result, the amount of positive charges of the substrate is reduced.

In another exemplary embodiment, a plasma processing method is provided. The plasma processing method includes preparing a substrate on a substrate support provided in a chamber of a plasma processing apparatus. The substrate support further includes an electrode. The plasma processing method includes outputting a first pulse from a power source system to the electrode in a first period as a bias voltage to draw ions from plasma in the chamber into the substrate. The plasma processing method further includes outputting a second pulse as the bias voltage from the power source system to the electrode in a second period. Each of the first pulse and the second pulse is a pulse of a voltage. A voltage level of the first pulse is different from a voltage level of the second pulse.

In an exemplary embodiment, the second period may be continuous with the first period. Each of the first pulse and the second pulse may be a pulse of a negative voltage. An absolute value of the voltage level of the first pulse may be smaller than an absolute value of the voltage level of the second pulse.

In an exemplary embodiment, each of the first pulse and the second pulse may be a pulse of a negative voltage. An absolute value of the voltage level of the first pulse may be larger than an absolute value of the voltage level of the second pulse. The plasma processing method may further include setting an output voltage from the power source system to the electrode to 0 V in a period between the first period and the second period.

In an exemplary embodiment, the second period may be continuous with the first period. Each of the first pulse and the second pulse may be a pulse of a negative voltage. An absolute value of the voltage level of the first pulse may be larger than an absolute value of the voltage level of the second pulse.

In an exemplary embodiment, the plasma processing method may further include outputting a third pulse from the power source system to the electrode in a third period after the second period. The third pulse may be a pulse of a negative voltage. An absolute value of a voltage level of the third pulse may be larger than the absolute value of the voltage level of the second pulse.

In an exemplary embodiment, the plasma processing method may further include outputting a pulse of a positive voltage from the power source system to the electrode before start of the first period within a subsequent cycle of two cycles, each of which includes the first period and the second period.

In an exemplary embodiment, the first pulse may be intermittently output from the power source system to the electrode in the first period. The second pulse may be intermittently output from the power source system to the electrode in the second period.

In an exemplary embodiment, each of the first pulse and the second pulse may be a pulse of a negative voltage. The plasma processing method may further include intermittently outputting a pulse of a positive voltage from the power source system to the electrode in the first period. The pulse of the positive voltage may be output alternately with the first pulse. The plasma processing method may further include intermittently outputting a pulse of a positive voltage from the power source system to the electrode in the second period. The pulse of the positive voltage may be output alternately with the second pulse.

In an exemplary embodiment, the plasma processing method may further include outputting a pulse of a positive voltage from the power source system to the electrode in a period between the first period and the second period.

Hereinafter, various exemplary embodiments will be described in detail with reference to the drawings. In the drawings, the same or equivalent portions are denoted by the same reference symbols.

FIG. 1 is a diagram schematically showing a plasma processing apparatus according to an exemplary embodiment. A plasma processing apparatus 1 shown in FIG. 1 is a capacitively coupled plasma processing apparatus. The plasma processing apparatus 1 is provided with a chamber 10. The chamber 10 provides an internal space 10s therein. The central axis of the chamber 10 is an axis AX and extends in a vertical direction.

In an embodiment, the chamber 10 may include a chamber body 12. The chamber body 12 has a substantially cylindrical shape. The internal space 10s is provided in the chamber body 12. The chamber body 12 is formed of for example, aluminum. The chamber body 12 is electrically grounded. A film having plasma resistance is formed on the inner wall surface of the chamber body 12, that is, a wall surface defining the internal space 10s. This film may be a film formed by anodization or a ceramic film such as a film formed of yttrium oxide.

A passage 12p is formed in a side wall of the chamber body 12. A substrate W passes through the passage 12p when it is transferred between the internal space 10s and the outside of the chamber 10. A gate valve 12g is provided along the side wall of the chamber body 12 for opening and closing of the passage 12p.

The plasma processing apparatus 1 is further provided with a substrate support 16. The substrate support 16 is configured to support the substrate W placed thereon in the chamber 10. The substrate W has a substantially disk shape. The substrate support 16 is supported by a support 15. The support 15 extends upward from a bottom portion of the chamber body 12. The support 15 has a substantially cylindrical shape. The support 15 is formed of an insulating material such as quartz.

The substrate support 16 has a lower electrode 18. The substrate support 16 may further have an electrostatic chuck 20. The substrate support 16 may further have an electrode plate 19. The electrode plate 19 is formed of a conductive material such as aluminum and has a substantially disk shape. The lower electrode 18 is provided on the electrode plate 19. The lower electrode 18 is formed of a conductive material such as aluminum and has a substantially disk shape. The lower electrode 18 is electrically connected to the electrode plate 19. The central axes of the lower electrode 18 and the electrode plate 19 substantially coincide with the axis AX.

A flow path 18f is provided in the lower electrode 18. The flow path 18f is a flow path for a heat exchange medium. As the heat exchange medium, for example, a refrigerant is used. A circulation device for the heat exchange medium (for example, a chiller unit) is connected to the flow path 18f. The circulation device is provided outside the chamber 10. The heat exchange medium from the circulation device is supplied to the flow path 18f through a pipe 23a. The heat exchange medium supplied to the flow path 18f is returned to the circulation device through a pipe 23b.

The electrostatic chuck 20 is provided on the lower electrode 18. When the substrate W is processed in the internal space 10s, the substrate W is placed on the electrostatic chuck 20 such that the center thereof is located on the axis AX. The electrostatic chuck 20 is configured to hold the substrate. The electrostatic chuck 20 has a main body and an electrode. The main body of the electrostatic chuck 20 is formed of a dielectric such as aluminum oxide or aluminum nitride. The main body of the electrostatic chuck 20 has a substantially disk shape. The central axis of the electrostatic chuck 20 substantially coincides with the axis AX.

The electrode of the electrostatic chuck 20 is provided in the main body of the electrostatic chuck 20. The electrode of the electrostatic chuck 20 has a film formed of a conductor. A direct-current power source is electrically connected to the electrode of the electrostatic chuck 20. When a direct-current voltage is applied from the direct-current power source to the electrode of the electrostatic chuck 20, an electrostatic attraction force is generated between the electrostatic chuck 20 and the substrate W. Due to the generated electrostatic attraction force, the substrate W is attracted to the electrostatic chuck 20 and held by the electrostatic chuck 20.

The substrate support 16 may further support an edge ring ER that is mounted thereon. The edge ring ER has a ring shape and is formed of, for example, silicon or silicon carbide. The edge ring ER is mounted on the substrate support 16 such that the central axis thereof is located on the axis AX. In an embodiment, the edge ring ER may be partially mounted on the electrostatic chuck 20. The substrate W is disposed on the electrostatic chuck 20 and in a region surrounded by the edge ring ER.

The plasma processing apparatus 1 may be further provided with a gas supply line 25. The gas supply line 25 supplies a heat transfer gas, for example, a He gas, from a gas supply mechanism to a gap between the upper surface of the electrostatic chuck 20 and the rear surface (lower surface) of the substrate W.

The plasma processing apparatus 1 may be further provided with a tubular part 28 and an insulating part 29. The tubular part 28 extends upward from the bottom portion of the chamber body 12. The tubular part 28 extends along the outer periphery of the support 15. The tubular part 28 is formed of a conductive material and has a substantially cylindrical shape. The tubular part 28 is electrically grounded. The insulating part 29 is provided on the tubular part 28. The insulating part 29 is formed of an insulating material. The insulating part 29 is formed of ceramic such as quartz, for example. The insulating part 29 has a substantially cylindrical shape. The insulating part 29 extends along the outer periphery of the electrode plate 19, the outer periphery of the lower electrode 18, and the outer periphery of the electrostatic chuck 20.

The plasma processing apparatus 1 is further provided with an upper electrode 30. The upper electrode 30 is provided above the substrate support 16. The upper electrode 30 closes an upper opening of the chamber body 12 together with a member 32. The member 32 is formed of an insulating material. The upper electrode 30 is supported on an upper portion of the chamber body 12 through the member 32.

The upper electrode 30 may include a ceiling plate 34 and a support 36. The lower surface of the ceiling plate 34 defines the internal space 10s. A plurality of gas discharge holes 34a are formed in the ceiling plate 34. The plurality of gas discharge holes 34a penetrate the ceiling plate 34 in a plate thickness direction (the vertical direction). The ceiling plate 34 is formed of for example, silicon. Alternatively, the ceiling plate 34 may have a structure in which a plasma-resistant film is provided on the surface of a member made of aluminum. This film may be a film formed by anodization or a ceramic film such as a film formed of yttrium oxide.

The support 36 detachably supports the ceiling plate 34. The support 36 is formed of a conductive material such as aluminum. A gas diffusion chamber 36a is provided in the interior of the support 36. A plurality of gas holes 36b extend downward from the gas diffusion chamber 36a. The plurality of gas holes 36b communicate with the plurality of gas discharge holes 34a, respectively. The support 36 has a gas introduction port 36c formed therein. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit. The gas source group 40 includes a plurality of gas sources. Each of the valve group 41 and the valve group 43 includes a plurality of valves (for example, on-off valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding valve of the valve group 41, a corresponding flow rate controller of the flow rate controller group 42, and a corresponding valve of the valve group 43. The plasma processing apparatus 1 can supply gases from one or more gas sources selected from the plurality of gas sources of the gas source group 40 to the internal space 10s at individually adjusted flow rates.

A baffle member 48 is provided between the tubular part 28 and the side wall of the chamber body 12. The baffle member 48 may be a plate-shaped member. The baffle member 48 may be configured, for example, by coating a plate member made of aluminum with ceramic such as yttrium oxide. A plurality of through-holes are formed in the baffle member 48. An exhaust pipe 52 is connected to the bottom portion of the chamber body 12 below the baffle member 48. An exhaust device 50 is connected to the exhaust pipe 52. The exhaust device 50 has a pressure controller such as an automatic pressure control valve, and a vacuum pump such as a turbo molecular pump, and is capable of reducing the pressure in the internal space 10s.

The plasma processing apparatus 1 is further provided with a radio frequency power source 61. The radio frequency power source 61 is a power source that generates first radio frequency power for plasma generation. The frequency of the first radio frequency power is a frequency within the range of 27 to 100 MHz, for example, a frequency of 40 MHz or 60 MHz. The radio frequency power source 61 is connected to the lower electrode 18 through a matcher 61m and the electrode plate 19. The matcher 61m has a matching circuit for matching the impedance on the load side (the lower electrode 18 side) of the radio frequency power source 61 with the output impedance of the radio frequency power source 61. The radio frequency power source 61 does not need to be electrically connected to the lower electrode 18, and may be connected to the upper electrode 30 through the matcher 61m.

The plasma processing apparatus 1 may be further provided with a radio frequency power source 62. The radio frequency power source 62 is a power source that generates second radio frequency power. The frequency of the second radio frequency power is lower than the frequency of the first radio frequency power. The radio frequency power source 62 is connected to the lower electrode 18 through a matcher 62m and the electrode plate 19. The matcher 62m has a matching circuit for matching the impedance on the load side (the lower electrode 18 side) of the radio frequency power source 62 with the output impedance of the radio frequency power source 62. The plasma processing apparatus 1 does not need to include the radio frequency power source 62 and the matcher 62m.

In the plasma processing apparatus 1, a gas is supplied from the gas supply unit to the internal space 10s. Then, the radio frequency power is supplied, whereby the gas is excited in the internal space 10s. As a result, plasma is generated in the internal space 10s. The substrate W is processed with chemical species such as ions and/or radicals from the plasma.

The plasma processing apparatus 1 is further provided with a power source system 70. The power source system 70 is electrically connected to the lower electrode 18. The power source system 70 is configured to apply a bias voltage to the lower electrode 18 to draw ions from the plasma into the substrate on the substrate support 16. The power source system 70 may be connected to the lower electrode 18 through a filter 70f. The filter 70f includes a filter circuit that cuts off or reduces the radio frequency power toward the power source system 70. The details of the power source system 70 will be described later.

The plasma processing apparatus 1 may be further provided with a controller MC. The controller MC is a computer which includes a processor, a storage device, an input device, a display device, and the like, and controls each part of the plasma processing apparatus 1. Specifically, the controller MC executes a control program stored in the storage device and controls each part of the plasma processing apparatus 1, based on recipe data stored in the storage device. A process designated by the recipe data is executed in the plasma processing apparatus 1 under the control by the controller MC. Plasma processing methods according to various embodiments may be performed in the plasma processing apparatus 1 under the control of each part of the plasma processing apparatus 1 by the controller MC.

Hereinafter, the bias voltage that is generated by the power source system 70 will be described with reference to FIGS. 2 to 6. FIGS. 2 to 6 are timing charts of the bias voltages of first to fifth examples, respectively. Further, the plasma processing methods according to various exemplary embodiments will also be described below.

In various exemplary embodiments, the plasma processing method includes a step of preparing the substrate W on the substrate support 16. The plasma processing method is performed in a state where the substrate W is placed on the substrate support 16.

The plasma processing method includes a step of generating plasma in the chamber 10. A processing gas is supplied from the gas supply unit into the chamber 10 in order to generate plasma. Further, the pressure of the gas in the chamber 10 is adjusted by the exhaust device 50 to a designated pressure. Further, the first radio frequency power is supplied from the radio frequency power source 61. As a result, plasma is generated from the processing gas in the chamber 10. The second radio frequency power from the radio frequency power source 62 may be supplied to the lower electrode 18 during the generation of the plasma. The steps of the plasma processing method that are described below are executed in a period in which the plasma is being generated in the chamber 10.

The plasma processing method includes a step of outputting a first pulse PL1 as the bias voltage from the power source system 70 to the lower electrode 18 in a first period P1, as shown in FIGS. 2 to 6. The first pulse PL1 is a pulse of a voltage. The first pulse PL1 may be a pulse of a direct-current voltage. The first pulse PL1 may have a waveform other than a rectangular wave such as a triangular wave or an impulse wave. The first pulse may have a waveform whose voltage value changes at the leading and trailing edges thereof.

The plasma processing method includes a step of outputting a second pulse PL2 as the bias voltage from the power source system 70 to the lower electrode 18 in a second period P2, as shown in FIGS. 2 to 6. The second period P2 is a period after the first period P1. The second pulse PL2 is a pulse of a voltage. The voltage level of the first pulse PL1 is different from the voltage level of the second pulse PL2. The second pulse PL2 may be a pulse of a direct-current voltage. The second pulse PL2 may have a waveform other than a rectangular wave such as a triangular wave or an impulse wave. The second pulse may have a waveform whose voltage value changes at the leading and trailing edges thereof.

In each of the examples shown in FIGS. 2 to 6, each of the first pulse PL1 and the second pulse PL2 is a pulse of a negative voltage (for example, a negative direct-current voltage). The difference between the voltage level of one (hereinafter referred to as an "H-level pulse") of the first pulse PL1 and the second pulse PL2 and the reference level (for example, 0 V) may be 6 kV or more. The difference between the voltage level of the H-level pulse and the reference level may be 10 kV or 20 kV or more. The difference between the voltage level of the other (hereinafter referred to as an "L-level pulse") of the first pulse PL1 and the second pulse PL2 and the reference level (for example, 0 V) may be 5 kV or less.

In the plasma processing method, as shown in FIGS. 2 to 6, a cycle CY may be repeated. The cycle CY includes the first period P1 and the second period P2. In the first to third examples shown in FIGS. 2 to 4, the frequency defining the cycle CY may be a frequency of 100 kHz or more and 1 MHz or less. In the fourth and fifth examples shown in FIGS. 5 and 6, the frequency defining the cycle CY may be 0.2 Hz or more and 1 Hz or less.

Figure 2:
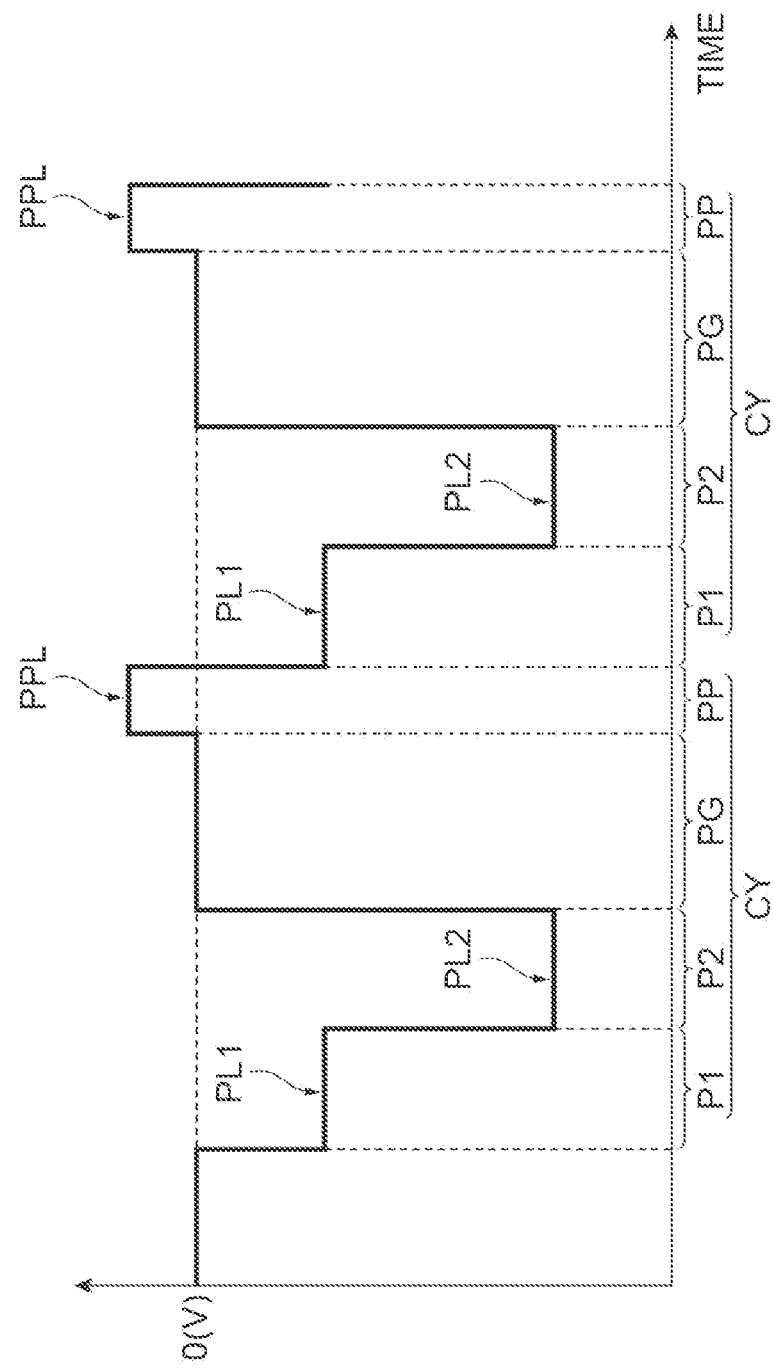
FIG. 2 is a timing chart of a bias voltage of a first example.

In an embodiment, as in the first example shown in FIG. 2, the second period P2 may be continuous with the first period P1. In this embodiment, the absolute value of the voltage level of the first pulse PL1 may be smaller than the absolute value of the voltage level of the second pulse PL2.

In the first example shown in FIG. 2, the reference level of the bias voltage is 0 V. This reference level may have a positive or negative value. In the first example, each of the voltage level of the first pulse PL1 and the voltage level of the second pulse PL2 may have any value, as long as the difference between the reference level and the voltage level of the first pulse PL1 is smaller than the difference between the reference level and the voltage level of the second pulse PL2. That is, in the first example, each of the voltage level of the first pulse PL1 and the voltage level of the second pulse PL2 may have any value, as long as the voltage level of the second pulse PL2 is lower than the voltage level of the first pulse PL1.

Figure 3:
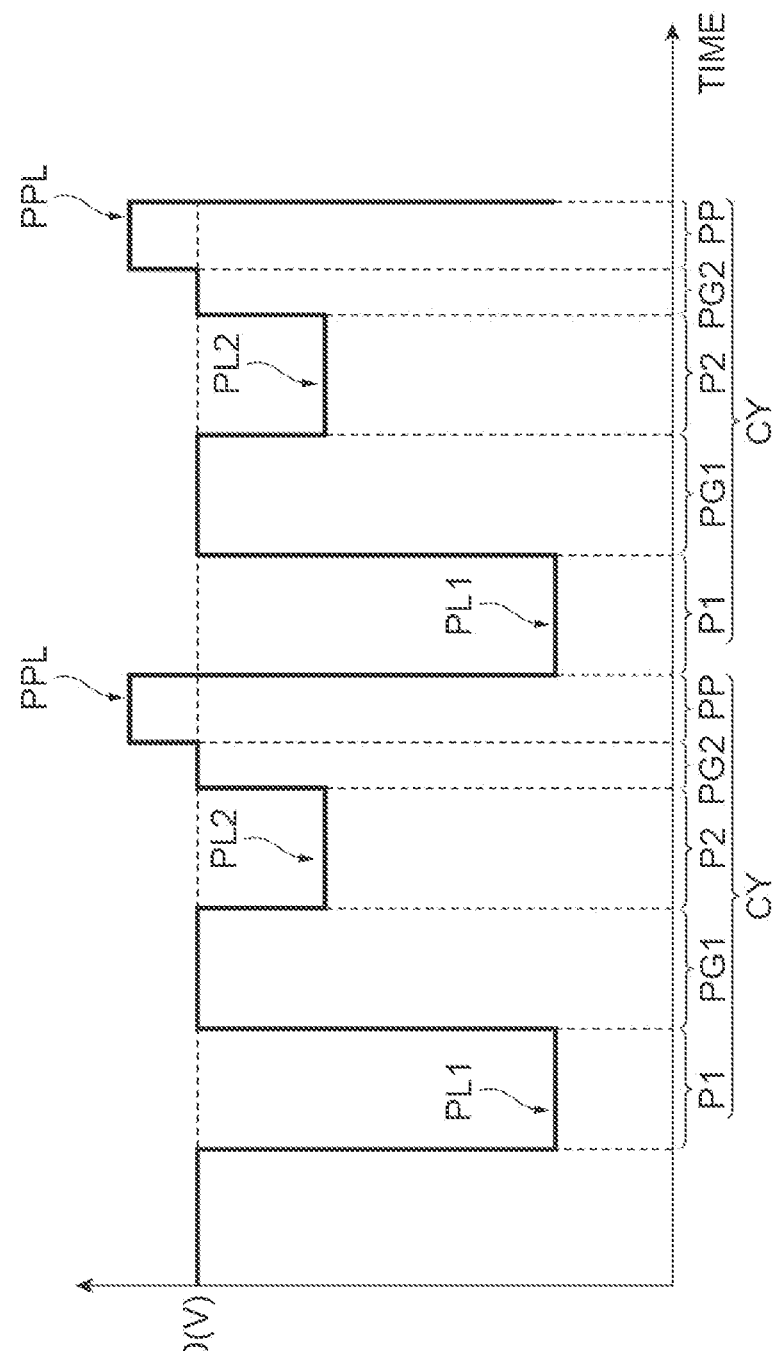
FIG. 3 is a timing chart of a bias voltage of a second example.

In another embodiment, as in the second example shown in FIG. 3, the absolute value of the voltage level of the first pulse PL1 may be larger than the absolute value of the voltage level of the second pulse PL2. In this embodiment, the plasma processing method may further include a step of setting the output voltage from the power source system 70 to the lower electrode 18 to 0 V in a period PG1 between the first period P1 and the second period P2.

Also in the second example shown in FIG. 3, the reference level of the bias voltage is 0 V. This reference level may have a positive or negative value. In the second example, each of the voltage level of the first pulse PL1 and the voltage level of the second pulse PL2 may have any value, as long as the difference between the reference level and the voltage level of the first pulse PL1 is larger than the difference between the reference level and the voltage level of the second pulse PL2. That is, in the second example, each of the voltage level of the first pulse PL1 and the voltage level of the second pulse PL2 may have any value, as long as the voltage level of the first pulse PL1 is lower than the voltage level of the second pulse PL2.

Figure 4:
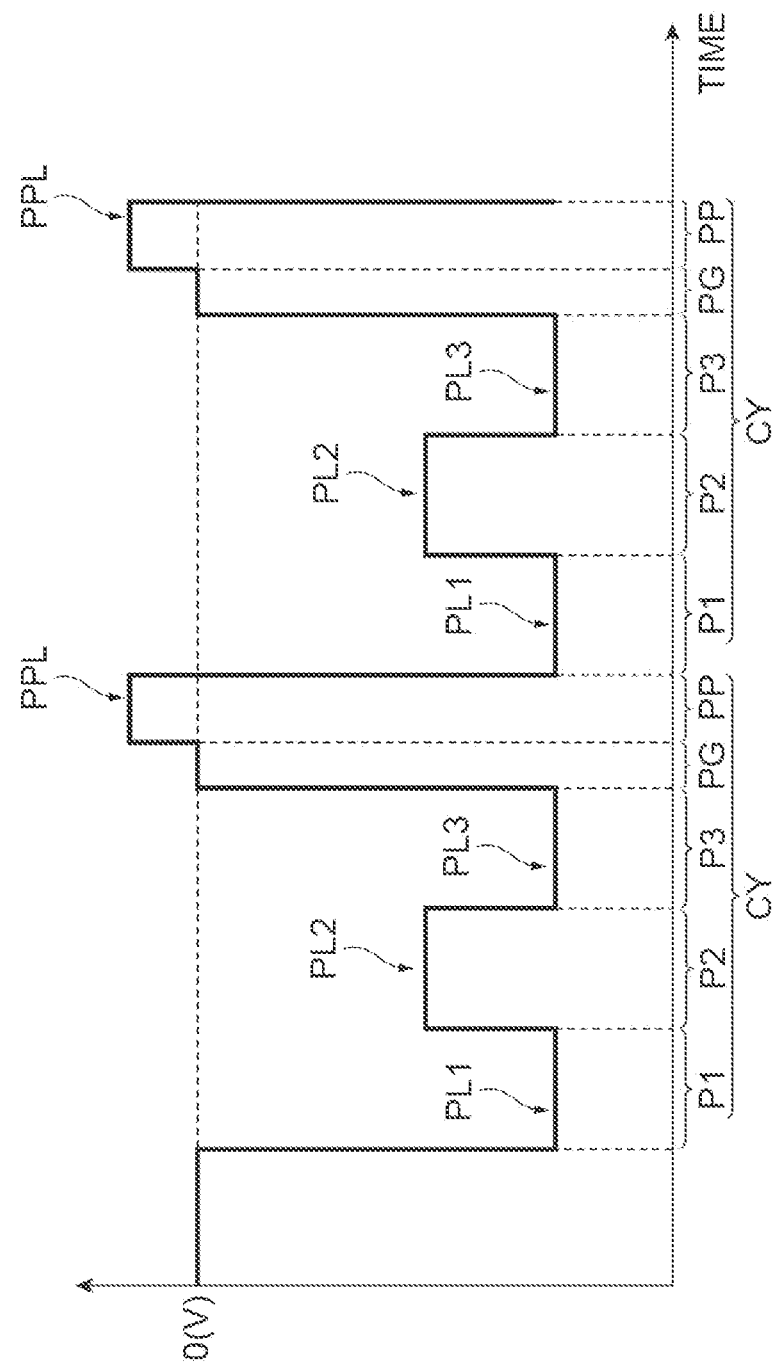
FIG. 4 is a timing chart of a bias voltage of a third example.

In still another embodiment, as in the third example shown in FIG. 4, the second period P2 may be continuous with the first period P1. In this embodiment, the absolute value of the voltage level of the first pulse PL1 may be larger than the absolute value of the voltage level of the second pulse PL2.

In still another embodiment, as in the third example shown in FIG. 4, the plasma processing method may further include a step of outputting a third pulse PL3 from the power source system 70 to the lower electrode 18 in a third period P3 after the second period P2. The third pulse PL3 may be a pulse of a negative voltage, and the absolute value of the voltage level of the third pulse PL3 may be larger than the absolute value of the voltage level of the second pulse PL2. The absolute value of the voltage level of the third pulse PL3 may be the same as the absolute value of the voltage level of the first pulse PL1. That is, the third pulse PL3 may be an H-level pulse. The difference between the voltage level of the third pulse PL3 and the reference level (for example, 0 V) may be 6 kV or more. The difference between the voltage level of the third pulse PL3 and the reference level may be 10 kV or 20 kV or more.

Also in the third example shown in FIG. 4, the reference level of the bias voltage is 0 V. This reference level may have a positive or negative value. In the third example, each of the voltage level of the first pulse PL1 and the voltage level of the second pulse PL2 may have any value, as long as the difference between the reference level and the voltage level of the first pulse PL1 is larger than the difference between the reference level and the voltage level of the second pulse PL2. That is, in the third example, each of the voltage level of the first pulse PL1 and the voltage level of the second pulse PL2 may have any value, as long as the voltage level of the first pulse PL1 is lower than the voltage level of the second pulse PL2. Further, in the third example, each of the voltage level of the third pulse PL3 and the voltage level of the second pulse PL2 may have any value, as long as the difference between the reference level and the voltage level of the third pulse PL3 is larger than the difference between the reference level and the voltage level of the second pulse PL2. That is, in the third example, each of the voltage level of the third pulse PL3 and the voltage level of the second pulse PL2 may have any value, as long as the voltage level of the third pulse PL3 is lower than the voltage level of the second pulse PL2.

In still another embodiment, the plasma processing method may further include a step of outputting a pulse PPL of a positive voltage, as in the first to third examples shown in FIGS. 2 to 4. The voltage level of the pulse PPL of the voltage is higher than the reference level (for example, 0 V). The pulse PPL of the voltage may be a pulse of a positive direct-current voltage. The pulse PPL is output in a period PP. The period PP is a period before the start of the first period P1 in the subsequent cycle CY of any two consecutive cycles CY. The period PP may be a period immediately before the subsequent first period P1. In this case, it becomes possible to supply ions having high energy to the substrate W in the subsequent first period P1.

In the first example shown in FIG. 2, the period PP is a period after a period PG. In the first example shown in FIG. 2, the period PG is a period after the second period P2. In the first example shown in FIG. 2, in the period PG the output voltage from the power source system 70 to the lower electrode 18 is set to 0 V (that is, the reference level).

In the second example shown in FIG. 3, the period PP is a period after a period PG2. In the second example shown in FIG. 3, the period PG2 is a period after the second period P2. In the second example shown in FIG. 3, in the period PG2, the output voltage from the power source system 70 to the lower electrode 18 is set to 0 V.

In the third example shown in FIG. 4, the period PP is a period after the period PG. In the third example shown in FIG. 4, the period PG is a period after the third period P3. In the third example shown in FIG. 4, in the period PG, the output voltage from the power source system 70 to the lower electrode 18 is set to 0 V (for example, the reference level).

Figure 5:
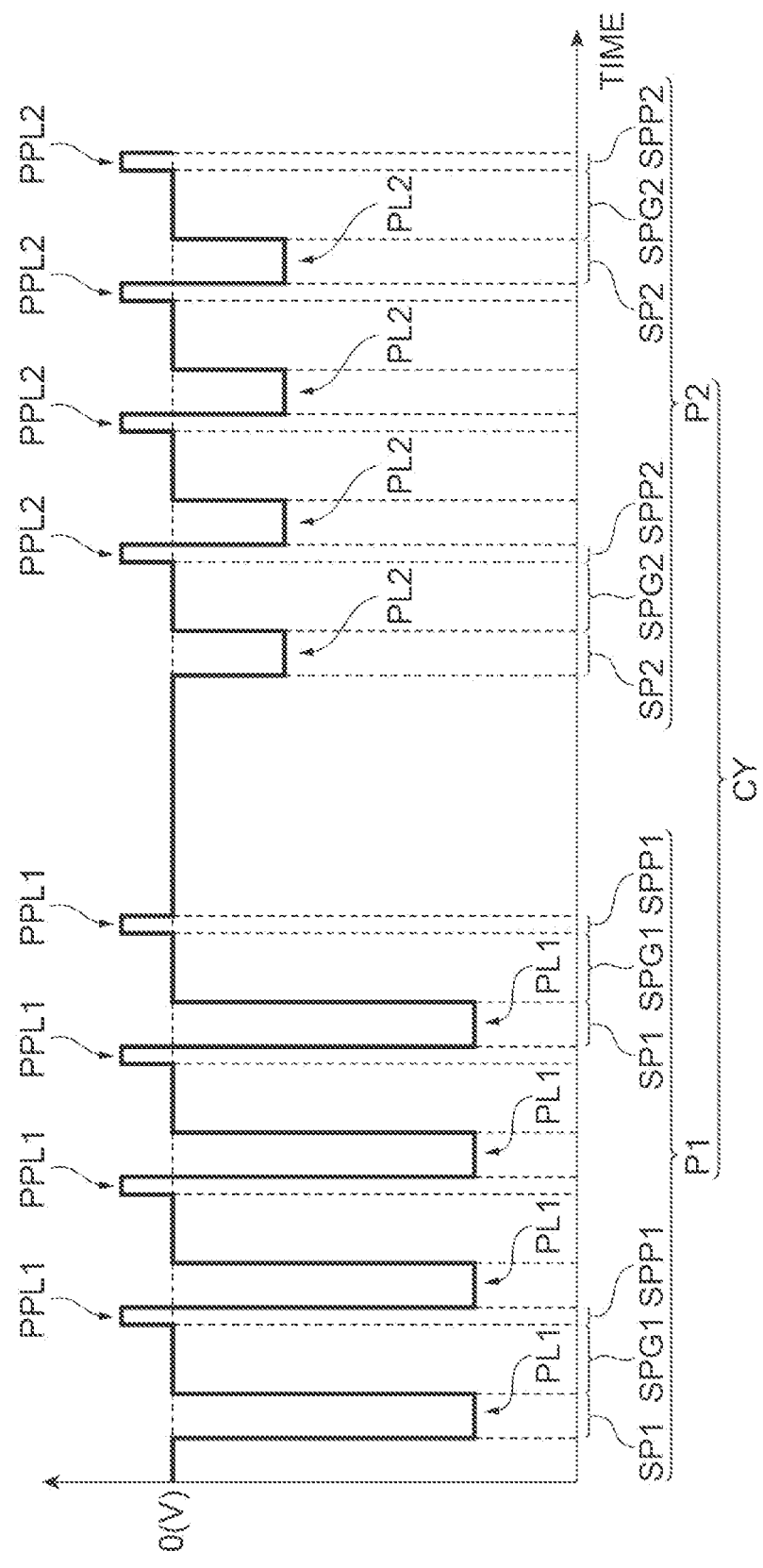
FIG. 5 is a timing chart of a bias voltage of a fourth example.
Figure 6:
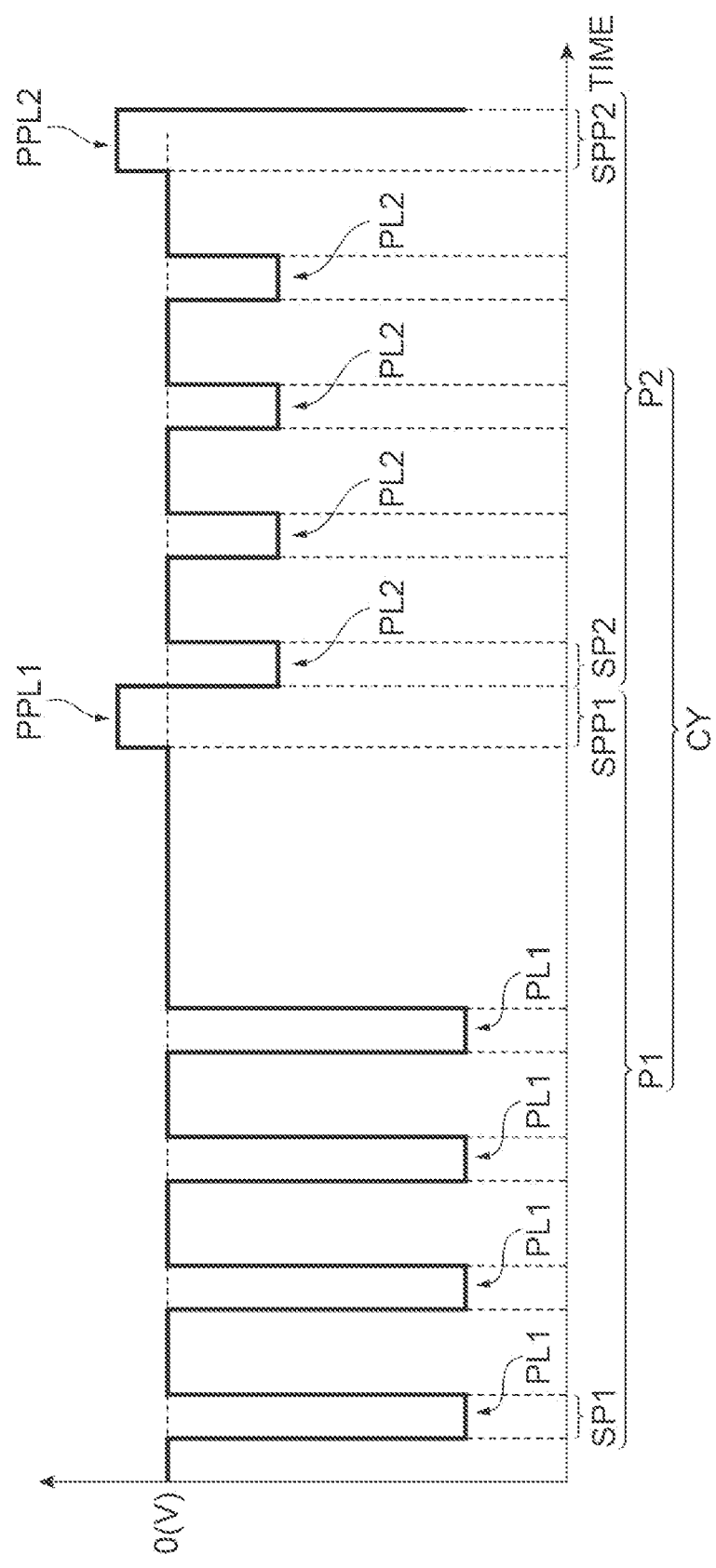
FIG. 6 is a timing chart of a bias voltage of a fifth example.

In still another embodiment, as in the fourth example shown in FIG. 5 and the fifth example shown in FIG. 6, the first pulse PL1 may be intermittently output from the power source system 70 to the lower electrode 18 in the first period P1. The first pulse PL1 may be periodically output from the power source system 70 to the lower electrode 18 in the first period P1. The first pulse PL1 is output in sub-periods SP1 within the first period P1. The first pulse PL1 may be periodically output at a frequency of 100 kHz or more and 1 MHz or less.

In still another embodiment, as in the fourth example shown in FIG. 5 and the fifth example shown in FIG. 6, the second pulse PL2 may be intermittently output from the power source system 70 to the lower electrode 18 in the second period P2. The second pulse PL2 may be periodically output from the power source system 70 to the lower electrode 18 in the second period P2. The second pulse PL2 is output in sub-periods SP2 within the second period P2. The second pulse PL2 may be periodically output at a frequency of 100 kHz or more and 1 MHz or less.

In the fourth example shown in FIG. 5 and the fifth example shown in FIG. 6, the absolute value of the voltage level of the first pulse PL1 is larger than the absolute value of the voltage level of the second pulse PL2. The absolute value of the voltage level of the first pulse PL1 may be smaller than the absolute value of the voltage level of the second pulse PL2.

Also in the fourth example shown in FIG. 5, the reference level of the bias voltage is 0 V. This reference level may have a positive or negative value. In the fourth example, each of the voltage level of the first pulse PL1 and the voltage level of the second pulse PL2 may have any value, as long as the difference between the reference level and the voltage level of the first pulse PL1 is different from the difference between the reference level and the voltage level of the second pulse PL2.

In still another embodiment, the plasma processing method may further include a step of intermittently outputting a pulse PPL1 of a positive voltage from the power source system 70 to the lower electrode 18 in the first period P1, as in the fourth example shown in FIG. 5. The voltage level of the pulse PPL1 of the voltage is higher than the reference level (for example, 0 V). The pulse PPL1 of the voltage may be a pulse of a positive direct-current voltage. In this embodiment, the pulse PPL1 of the positive voltage may be output alternately with the first pulse PL1. The pulse PPL1 of the positive voltage is output in periods SPP1. The periods SPP1 may be periods after the respective periods SPG1. The periods SPG1 are periods after the respective sub-periods SP1. In the periods SPG1, the output voltage from the power source system 70 to the lower electrode 18 may be set to 0 V (that is, the reference level). The periods SPP1 may be periods immediately before the respective subsequent sub-periods SP1. In this case, it becomes possible to supply ions having high energy to the substrate W in the subsequent sub-periods SP1.

In still another embodiment, the plasma processing method may further include a step of intermittently outputting a pulse PPL2 of a positive voltage from the power source system 70 to the lower electrode 18 in the second period P2, as in the fourth example shown in FIG. 5. The voltage level of the pulse PPL2 of the voltage is higher than the reference level (for example, 0 V). The pulse PPL2 of the voltage may be a pulse of a positive direct-current voltage. In this embodiment, the pulse PPL2 of the positive voltage may be output alternately with the second pulse PL2. The pulse PPL2 of the positive voltage is output in periods SPP2. The periods SPP2 may be periods after the respective periods SPG2. The periods SPG2 is periods after the respective sub-periods SP2. In the periods SPG2, the output voltage from the power source system 70 to the lower electrode 18 may be set to 0 V (that is, the reference level). The periods SPP2 may be periods immediately before the respective subsequent sub-periods SP2. In this case, it becomes possible to supply ions having high energy to the substrate W in the subsequent sub-period SP2.

In still another embodiment, the plasma processing method may further include a step of outputting the pulse PPL1 of the positive voltage from the power source system 70 to the lower electrode 18 in the period SPP1 between the first period P1 and the second period P2, as in the fifth example shown in FIG. 6. The voltage level of the pulse PPL1 of the voltage is higher than the reference level (for example, 0 V). The pulse PPL1 of the voltage may be a pulse of a positive direct-current voltage. The period SPP1 may be a period immediately before the subsequent sub-period SP2. In this case, it becomes possible to supply ions having high energy to the substrate W in the subsequent sub-period SP2.

In still another embodiment, the plasma processing method may further include a step of outputting the pulse PPL2 of the positive voltage from the power source system 70 to the lower electrode 18 in the period SPP2, as in the fifth example shown in FIG. 6. The voltage level of the pulse PPL2 of the voltage is higher than the reference level (for example, 0 V). The pulse PPL2 of the voltage may be a pulse of a positive direct-current voltage. The period SPP2 may be a period between the second period P2 and the subsequent first period P1. The period SPP2 may be a period immediately before the subsequent sub-period SP1. In this case, it becomes possible to supply ions having high energy to the substrate W in the subsequent sub-period SP1.

Also in the fifth example shown in FIG. 6, the reference level of the bias voltage is 0 V. This reference level may have a positive or negative value. In the fifth example, each of the voltage level of the first pulse PL1 and the voltage level of the second pulse PL2 may have any value, as long as the difference between the reference level and the voltage level of the first pulse PL1 is different from the difference between the reference level and the voltage level of the second pulse PL2.

In the various exemplary embodiments described above, the energy of the ions that are supplied from the plasma to the substrate W in the first period P1 and the energy of the ions that are supplied from the plasma to the substrate W in the second period P2 are different. Therefore, it becomes possible to supply ions having different energies to the substrate W.

Further, in some exemplary embodiments, the pulse of the positive direct-current voltage is supplied to the lower electrode 18. The pulse of the positive direct-current voltage is supplied to the lower electrode 18, whereby electrons are supplied to the substrate W. As a result, the amount of positive charges of the substrate W is reduced.

In a case of forming an opening in the substrate W by etching a film of the substrate W by using the bias voltage of each of the first to third examples, in the period in which the L-level pulse is supplied, deposits on the substrate W are removed, so that the shape of the opening can be adjusted. Further, in this case, ions can be supplied to the bottom of a deep opening in the period in which the H-level pulse is supplied.

The bias voltages of the fourth and fifth examples can be used for etching of a multilayer film having different types of films. The bias voltages of the fourth and fifth examples can be used for etching in the manufacture of a NAND device, for example. In the manufacture of the NAND device, a multilayer film including alternately laminated layers of a silicon oxide film and a silicon nitride film or a polycrystalline silicon film are etched. The silicon oxide film can be etched with ions having relatively high energy, and the silicon nitride film or the polycrystalline silicon film can be etched with ions having relatively low energy. In a case of using the bias voltages of the fourth and fifth examples, the silicon oxide film may be etched in the first period P1 and the silicon nitride film or the polycrystalline silicon film may be etched in the second period P2.

Hereinafter, power source systems according to some exemplary embodiments that can be adopted as the power source system 70 of the plasma processing apparatus 1 will be described.

Figure 7:
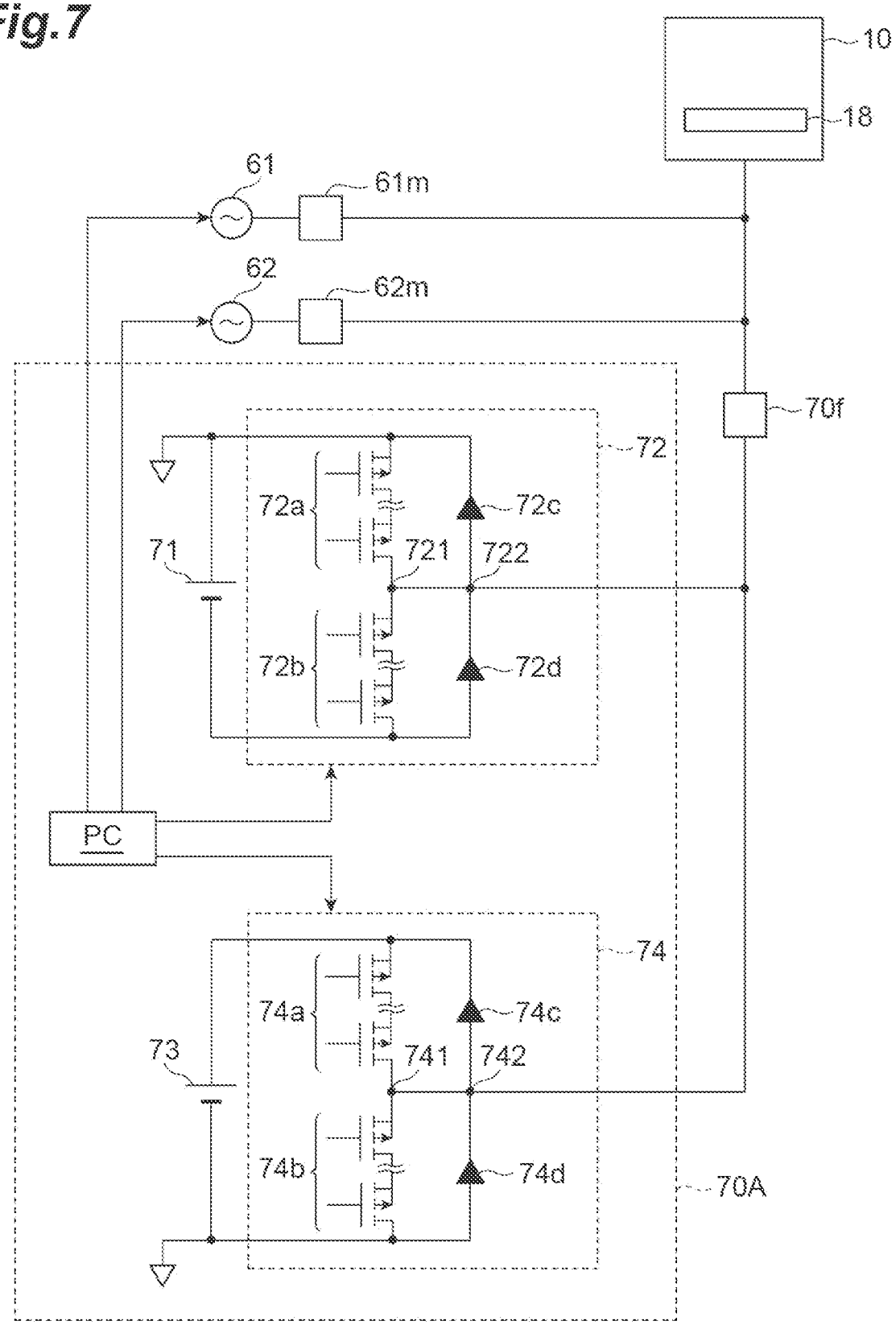
FIG. 7 illustrates a power source system according to an exemplary embodiment.

FIG. 7 is a diagram showing a power source system according to an exemplary embodiment. A power source system 70A shown in FIG. 7 can be adopted as the power source system 70 of the plasma processing apparatus 1. The power source system 70A can output the bias voltages of the first to fifth examples described above. The power source system 70A may include a direct-current power source 71, a pulse unit 72, and a pulse controller PC.

The direct-current power source 71 is a power source that generates a negative direct-current voltage. The positive terminal of the direct-current power source 71 is connected to the ground. The direct-current power source 71 may be a variable direct-current power source.

The pulse unit 72 is configured to generate a pulse of a voltage from the negative direct-current voltage from the direct-current power source 71. In an embodiment, the pulse unit 72 may include one or more switching transistors 72a, one or more switching transistors 72b, a diode 72c, and a diode 72d.

The one or more switching transistors 72a are connected between the positive terminal of the direct-current power source 71 and a node 721. In a case where the pulse unit 72 includes a plurality of switching transistors 72a, these switching transistors 72a are connected in series between the positive terminal of the direct-current power source 71 and the node 721.

The one or more switching transistors 72b are connected between the negative terminal of the direct-current power source 71 and the node 721. In a case where the pulse unit 72 includes a plurality of switching transistors 72b, these switching transistors 72b are connected in series between the negative terminal of the direct-current power source 71 and the node 721.

The diode 72c is connected in parallel with the one or more switching transistors 72a. The diode 72c is connected between the positive terminal of the direct-current power source 71 and a node 722. The cathode of the diode 72c is connected to the positive terminal of the direct-current power source 71, and the anode of the diode 72c is connected to the node 722. The node 722 is connected to the node 721.

The diode 72d is connected in parallel with the one or more switching transistors 72b. The diode 72d is connected between the negative terminal of the direct-current power source 71 and the node 722. The anode of the diode 72d is connected to the negative terminal of the direct-current power source 71, and the cathode of the diode 72d is connected to the node 722.

The pulse controller PC is configured to set an output period of the pulse of the voltage from the pulse unit 72 by supplying a control signal to the pulse unit 72. In an embodiment, the pulse controller PC supplies a pulse control signal as the control signal to the control terminals of the one or more switching transistors 72a and the control terminals of the one or more switching transistors 72b.

When the one or more switching transistors 72a enter a closed state and the one or more switching transistors 72b enter an open state by the pulse control signal from the pulse controller PC, the node 722 is connected to the ground. As a result, the output voltage of the power source system 70A becomes 0 V (that is, the reference level).

When the one or more switching transistors 72a enter an open state and the one or more switching transistors 72b enter a closed state by the pulse control signal from the pulse controller PC, the node 722 is connected to the negative terminal of the direct-current power source 71. As a result, a pulse of a negative voltage (for example, a negative direct-current voltage) is output from the power source system 70A. Each of the first pulse, the second pulse, and the third pulse described above is generated by adjusting the voltage level of the pulse that is output from the node 722 by adjusting the output voltage level of the direct-current power source 71.

In an embodiment, the power source system 70A may further include a direct-current power source 73 and a pulse unit 74. The direct-current power source 73 is a power source that generates a positive direct-current voltage. The negative terminal of the direct-current power source 73 is connected to the ground. The direct-current power source 73 may be a variable direct-current power source.

The pulse unit 74 is configured to generate a pulse of a voltage from the positive direct-current voltage from the direct-current power source 73. In an embodiment, the pulse unit 74 may include one or more switching transistors 74a, one or more switching transistors 74b, a diode 74c, and a diode 74d.

The one or more switching transistors 74a are connected between the positive terminal of the direct-current power source 73 and a node 741. In a case where the pulse unit 74 includes a plurality of switching transistors 74a, these switching transistors 74a are connected in series between the positive terminal of the direct-current power source 73 and the node 741.

The one or more switching transistors 74b are connected between the negative terminal of the direct-current power source 73 and the node 741. In a case where the pulse unit 74 includes a plurality of switching transistors 74b, these switching transistors 74b are connected in series between the negative terminal of the direct-current power source 73 and the node 741.

The diode 74c is connected in parallel with the one or more switching transistors 74a. The diode 74c is connected between the positive terminal of the direct-current power source 73 and a node 742. The cathode of the diode 74c is connected to the positive terminal of the direct-current power source 73, and the anode of the diode 74c is connected to the node 742. The node 742 is connected to the node 741.

The diode 74d is connected in parallel with the one or more switching transistors 74b. The diode 74d is connected between the negative terminal of the direct-current power source 73 and the node 742. The anode of the diode 74d is connected to the negative terminal of the direct-current power source 73, and the cathode of the diode 74d is connected to the node 742.

The pulse controller PC is configured to set an output period of the pulse of the voltage from the pulse unit 74 by supplying a control signal to the pulse unit 74. In an embodiment, the pulse controller PC supplies a pulse control signal as the control signal to the control terminals of the one or more switching transistors 74a and the control terminals of the one or more switching transistors 74b.

When the one or more switching transistors 74a enter an open state and the one or more switching transistors 74b enter a closed state by the pulse control signal from the pulse controller PC, the node 742 is connected to the ground. As a result, the output voltage of the power source system 70A becomes 0 V (that is, the reference level).

When the one or more switching transistors 74a enter a closed state and the one or more switching transistors 74b enter an open state by the pulse control signal from the pulse controller PC, the node 742 is connected to the positive terminal of the direct-current power source 73. As a result, a pulse of a positive voltage (for example, a positive direct-current voltage) is output from the power source system 70A.

When the pulse of the negative voltage is output from the power source system 70A, the one or more switching transistors 74a and the one or more switching transistors 74b may be set to an open state. Further, when the pulse of the positive voltage is output from the power source system 70A, the one or more switching transistors 72a and the one or more switching transistors 72b may be set to an open state.

In an embodiment, the pulse controller PC may supply the pulse control signal to the radio frequency power source 61 and/or the radio frequency power source 62. The radio frequency power source 61 may output the pulse of the first radio frequency power according to the pulse control signal. The pulse of the first radio frequency power may be output in the same phase as, or may be output in a different phase from, the pulse of the direct-current voltage that is output from the power source system 70A. The radio frequency power source 62 may output the pulse of the second radio frequency power according to the pulse control signal. The pulse of the second radio frequency power may be output in the same phase as, or may be output in a different phase from, the pulse of the direct-current voltage that is output from the power source system 70A. The radio frequency power source 61 may output a continuous wave of the first radio frequency power. Further, the radio frequency power source 62 may output a continuous wave of the second radio frequency power.

Figure 8:
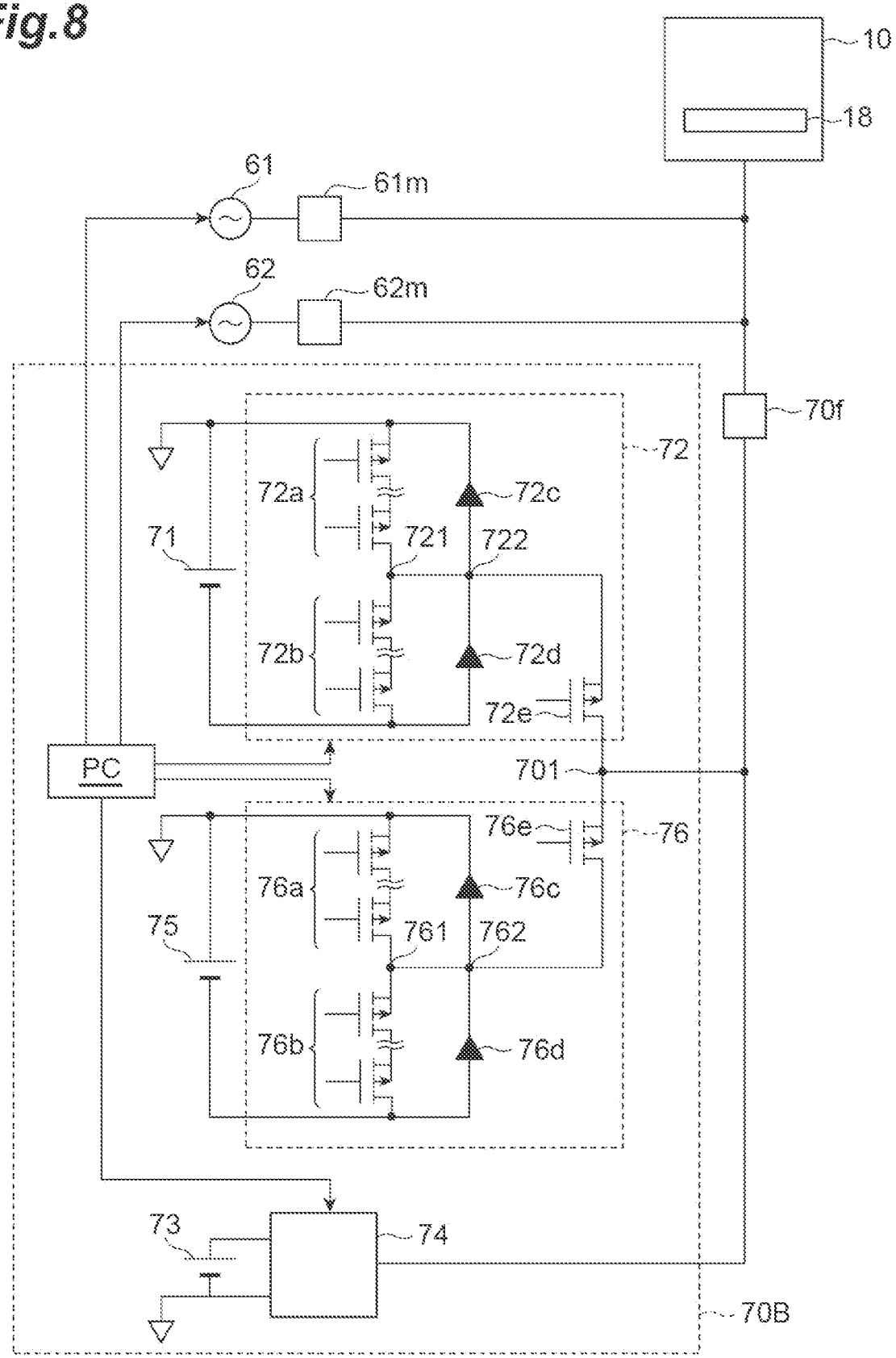
FIG. 8 illustrates a power source system according to another exemplary embodiment.

Hereinafter, FIG. 8 will be referred to. FIG. 8 is a diagram showing a power source system according to another exemplary embodiment. A power source system 70B shown in FIG. 8 can be adopted as the power source system 70 of the plasma processing apparatus 1. The power source system 70B can output the bias voltages of the first to fifth examples described above. Hereinafter, the differences between the power source system 70B and the power source system 70A will be described.

The pulse unit 72 of the power source system 70B further includes a switching transistor 72e. The switching transistor 72e is connected between the node 722 and a node 701. The node 701 is connected to the lower electrode 18.

The switching transistor 72e switches between an open state and a closed state according to the control signal (pulse control signal) that is supplied from the pulse controller PC to the control terminal thereof. When the switching transistor 72e is in an open state, the pulse unit 72 is electrically separated from the node 701 and the lower electrode 18. When the switching transistor 72e is in a closed state, the pulse unit 72 is connected to the node 701 and the lower electrode 18, and a pulse of a negative voltage is output from the pulse unit 72 to the lower electrode 18. The pulse of the negative voltage that is output from the pulse unit 72 to the lower electrode 18 is used as one of the first pulse PL1 and the second pulse PL2. In a case where the pulse unit 72 outputs the first pulse PL1, the pulse unit 72 may further output the third pulse PL3.

The power source system 70B further includes a direct-current power source 75 and a pulse unit 76. The direct-current power source 75 is a power source that generates a negative direct-current voltage. The positive terminal of the direct-current power source 75 is connected to the ground. The direct-current power source 75 may be a variable direct-current power source. The level of the negative direct-current voltage that is generated by the direct-current power source 75 is different from the level of the negative direct-current voltage that is generated by the direct-current power source 71.

The pulse unit 76 is configured to generate a pulse of a voltage from the negative direct-current voltage from the direct-current power source 75. In an embodiment, the pulse unit 76 may include one or more switching transistors 76a, one or more switching transistors 76b, a diode 76c, a diode 76d, and a switching transistors 76e.

The one or more switching transistors 76a are connected between the positive terminal of the direct-current power source 75 and a node 761. In a case where the pulse unit 76 includes a plurality of switching transistors 76a, these switching transistors 76a are connected in series between the positive terminal of the direct-current power source 75 and the node 761.

The one or more switching transistors 76b are connected between the negative terminal of the direct-current power source 75 and the node 761. In a case where the pulse unit 76 includes a plurality of switching transistors 76b, these switching transistors 76b are connected in series between the negative terminal of the direct-current power source 75 and the node 761.

The diode 76c is connected in parallel with the one or more switching transistors 76a. The diode 76c is connected between the positive terminal of the direct-current power source 75 and a node 762. The cathode of the diode 76c is connected to the positive terminal of the direct-current power source 75, and the anode of the diode 76c is connected to the node 762. The node 762 is connected to the node 761. The node 762 is connected to the node 701 through the switching transistor 76e. That is, the switching transistor 76e is connected between the node 762 and the node 701.

The diode 76d is connected in parallel with the one or more switching transistors 76b. The diode 76d is connected between the negative terminal of the direct-current power source 75 and the node 762. The anode of the diode 76d is connected to the negative terminal of the direct-current power source 75, and the cathode of the diode 76d is connected to the node 762.

In the power source system 70B, the pulse controller PC is configured to set an output period of the pulse of the voltage from the pulse unit 76 by supplying a control signal to the pulse unit 76. In an embodiment, the pulse controller PC supplies a pulse control signal as the control signal to the control terminals of the one or more switching transistors 76a and the control terminals of the one or more switching transistors 76b.

Further, in the power source system 70B, the pulse controller PC is configured to supply the pulse control signal to the control terminal of the switching transistor 76e. The switching transistor 76e switches between an open state and a closed state according to the pulse control signal that is supplied from the pulse controller PC to the control terminal thereof.

When the switching transistor 76e is in an open state, the pulse unit 76 is electrically separated from the node 701 and the lower electrode 18. When the switching transistor 76e is in a closed state, the pulse unit 76 is connected to the node 701 and the lower electrode 18.

When the one or more switching transistors 76a enter a closed state and the one or more switching transistors 76b enter an open state by the pulse control signal from the pulse controller PC, the node 762 is connected to the ground. As a result, the voltage in the node 762 becomes 0 V (that is, the reference level).

When the one or more switching transistors 76a enter an open state and the one or more switching transistors 76b enter a closed state by the pulse control signal from the pulse controller PC, the node 762 is connected to the negative terminal of the direct-current power source 75.

When the pulse unit 76 is connected to the node 701 and the node 762 is connected to the negative terminal of the direct-current power source 75, a pulse of a negative voltage (for example, a negative direct-current voltage) is output from the pulse unit 76. The pulse of the negative voltage that is output from the pulse unit 76 to the lower electrode 18 is used as the other of the first pulse PL1 and the second pulse PL2. In a case where the pulse unit 76 outputs the first pulse PL1, the pulse unit 76 may further output the third pulse PL3.

Figure 9:
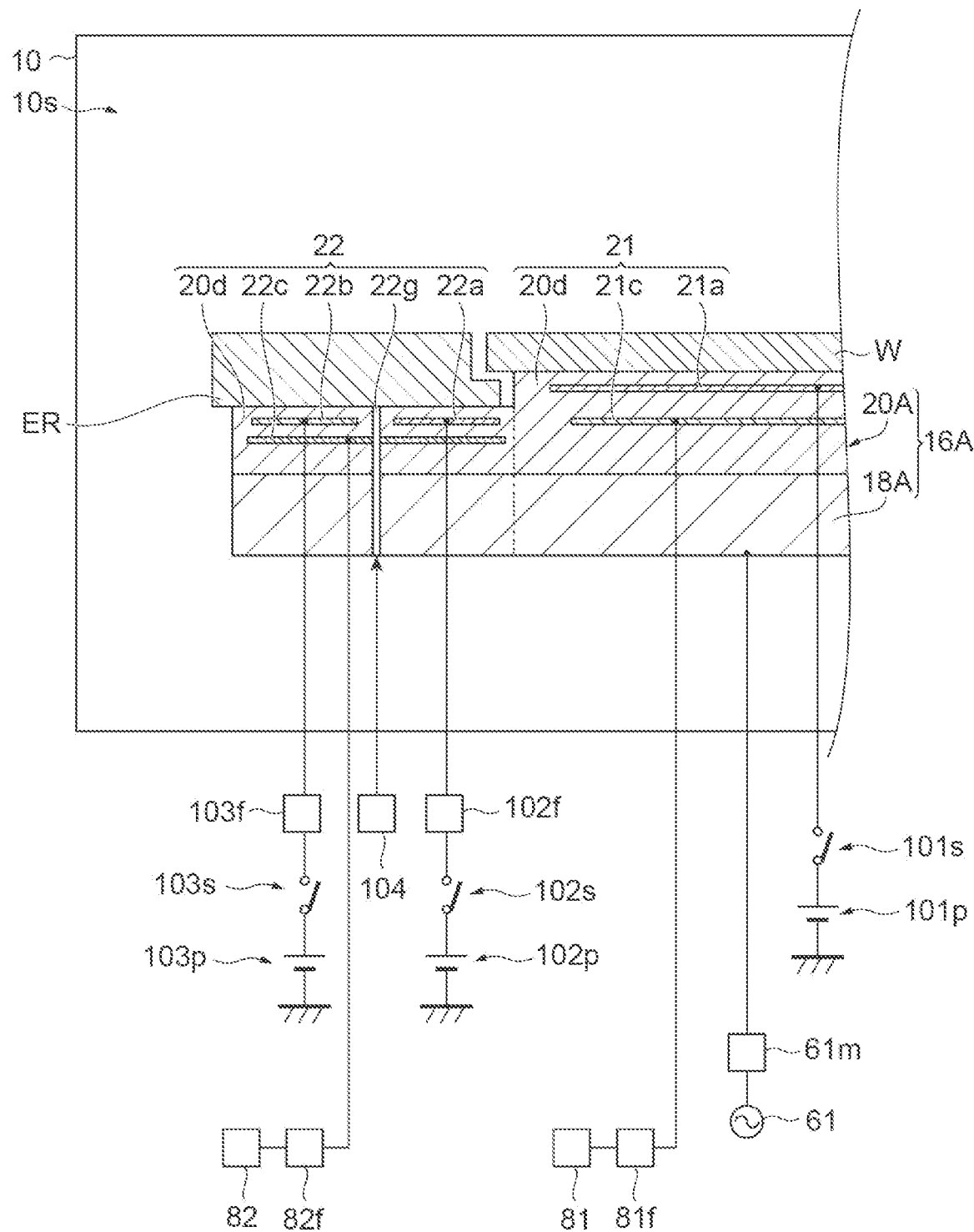
FIG. 9 illustrates a configuration of a substrate support according to another exemplary embodiment.

Hereinafter, FIG. 9 will be referred to. FIG. 9 is a diagram showing a configuration of a substrate support according to another exemplary embodiment. A substrate support 16A shown in FIG. 9 can be adopted in place of the substrate support 16 in the plasma processing apparatus 1.

The substrate support 16A has a lower electrode 18A and an electrostatic chuck 20A. The lower electrode 18A is formed of a conductive material such as aluminum and has a substantially disk shape. The radio frequency power source 61 may be connected to the lower electrode 18A through the matcher 61m. As described above, the radio frequency power source 61 may be connected to the upper electrode 30 through the matcher 61m.

The electrostatic chuck 20A is provided on the lower electrode 18A. The electrostatic chuck 20A has a dielectric portion 20d and an electrode 21a. The electrostatic chuck 20A may further have an electrode 22a and an electrode 22b. When the substrate W is processed in the internal space 10s, the substrate W is placed on the electrostatic chuck 20A and held by the electrostatic chuck 20A. Further, the edge ring ER is mounted on the substrate support 16A. The edge ring ER is mounted on the substrate support 16A such that the central axis thereof coincides with the axis AX. The substrate W accommodated in the chamber 10 is disposed on the electrostatic chuck 20A and in the region surrounded by the edge ring ER.

The substrate support 16A has a first region 21 and a second region 22. In FIG. 9, the boundary between the first region 21 and the second region 22 is shown by a broken line. The first region 21 is a central region of the substrate support 16A. The first region 21 includes a central region of the electrostatic chuck 20A and a central region of the lower electrode 18A. The second region 22 extends in a circumferential direction on the outside in a radial direction with respect to the first region 21. The second region 22 includes a peripheral region of the electrostatic chuck 20A and a peripheral region of the lower electrode 18A. The electrostatic chuck of the first region 21 and the electrostatic chuck of the second region 22 may be provided by a single electrostatic chuck. That is, the electrostatic chuck of the first region 21 and the electrostatic chuck of the second region 22 may be integrated. In another embodiment, the electrostatic chuck of the first region 21 and the electrostatic chuck of the second region 22 may be separate electrostatic chucks.

The first region 21 is configured to support the substrate W that is placed thereon (that is, on the upper surface thereof). The first region 21 is a region having a disk shape. The central axis of the first region 21 substantially coincides with the axis AX. The first region 21 shares the dielectric portion 20d with the second region 22. The dielectric portion 20d is formed of a dielectric such as aluminum nitride or aluminum oxide. The dielectric portion 20d has a substantially disk shape. In an embodiment, the thickness of the dielectric portion 20d in the second region 22 is smaller than the thickness of the dielectric portion 20d in the first region 21. The position in the vertical direction of the upper surface of the dielectric portion 20d in the second region 22 may be lower than the position in the vertical direction of the upper surface of the dielectric portion 20d in the first region 21.

The first region 21 has the electrode 21a (a chuck electrode). The electrode 21a is an electrode having a shape of a film and is provided in the dielectric portion 20d within the first region 21. A direct-current power source 101p is connected to the electrode 21a through a switch 101s. When the direct-current voltage from the direct-current power source 101p is applied to the electrode 21a, an electrostatic attraction force is generated between the first region 21 and the substrate W. Due to the generated electrostatic attraction force, the substrate W is attracted to the first region 21 and held by the first region 21.

The first region 21 further has a first electrode 21c. The first electrode 21c is an electrode having a shape of a film and is provided in the dielectric portion 20d within the first region 21. The electrode 21a may extend closer to the upper surface of the first region 21 than the first electrode 21c in the vertical direction.

A power source system 81 is connected to the first electrode 21c through a filter 81f. The power source system 81 has the same configuration as the power source system 70 and is configured to apply the bias voltage described above to the first electrode 21c. The filter 81f has the same configuration as the filter 70f.

The second region 22 extends to surround the first region 21. The second region 22 is a substantially annular region. The central axis of the second region 22 substantially coincides with the axis AX. The second region 22 is configured to support the edge ring ER that is placed thereon (that is, on the upper surface thereof). The second region 22 shares the dielectric portion 20d with the first region 21.

In an embodiment, the second region 22 may hold the edge ring ER by an electrostatic attraction force. In this embodiment, the second region 22 may have one or more electrodes (chuck electrodes). In the example shown in FIG. 9, the second region 22 has a pair of electrodes, that is, the electrodes 22a and 22b. The electrodes 22a and 22b are provided in the dielectric portion 20d within the second region 22. The electrodes 22a and 22b configure a bipolar electrode. Each of the electrodes 22a and 22b is an electrode having a shape of a film. The electrodes 22a and 22b may extend at substantially the same height position in the vertical direction.

A direct-current power source 102p is connected to the electrode 22a through a switch 102s and a filter 102f. The filter 102f is configured to cut off or attenuate radio frequency power. A direct-current power source 103p is connected to the electrode 22b through a switch 103s and a filter 103f. The filter 103f is configured to cut off or reduce radio frequency power.

The direct-current power source 102p and the direct-current power source 103p apply a direct-current voltage to the electrode 22a and the electrode 22b, respectively, in order to generate an electrostatic attraction force that attracts the edge ring ER to the second region 22. The set potential of each of the electrodes 22a and 22b may be any of a positive potential, a negative potential, and 0 V. For example, the potential of the electrode 22a may be set to a positive potential, and the potential of the electrode 22b may be set to a negative potential. Further, the potential difference between the electrodes 22a and 22b may be formed by using a single direct-current power source, instead of two direct-current power sources.

When direct-current voltages are applied to the electrodes 22a and 22b, an electrostatic attraction force is generated between the second region 22 and the edge ring ER. The edge ring ER is attracted to the second region 22 by the generated electrostatic attraction force and is held by the second region 22.

The second region 22 further has a second electrode 22c. The second electrode 22c is an electrode having a shape of a film. The second electrode 22c is provided in the dielectric portion 20d within the second region 22. The second electrode 22c is separated from the first electrode 21c. The electrodes 22a and 22b may extend closer to the upper surface of the second region 22 than the second electrode 22c in the vertical direction. The second electrode 22c may be disposed outside the second region 22. For example, the second electrode 22c may be provided below the edge ring ER and in the insulating part 29.

A power source system 82 is connected to the second electrode 22c through a filter 82f. The power source system 82 has the same configuration as the power source system 70 and is configured to apply the bias voltage described above to the second electrode 22c. The filter 82f has the same configuration as the filter 70f. A bias voltage that is applied to the second electrode 22c by the power source system 82 may be synchronized with a bias voltage that is applied to the first electrode 21c by the power source system 81. The phase of the bias voltage that is applied to the second electrode 22c by the power source system 82 may coincide with the phase of the bias voltage that is applied to the first electrode 21c by the power source system 81. The bias voltage that is applied to the second electrode 22c by the power source system 82 may have a phase difference with respect to the bias voltage that is applied to the first electrode 21c by the power source system 81.

The second region 22 may further have a gas line 22g. The gas line 22g is a gas line provided to supply a heat transfer gas, for example, a He gas, to the gap between the second region 22 and the edge ring ER. The gas line 22g is connected to a gas supply mechanism 104 which is a source for the heat transfer gas.

The power source system 81 may be connected to the electrode 21a. In this case, the substrate support 16A does not need to have the first electrode 21c. Further, the power source system 82 may be connected to at least one of the electrode 22a and the electrode 22b. In this case, the substrate support 16A does not need to have the second electrode 22c. Further, the second region 22 does not need to have the electrode 22a and the electrode 22b. Further, the power source system 81 may apply a bias voltage to the first electrode 21c and the second electrode 22c. In this case, the plasma processing apparatus 1 does not need to be provided with the power source system 82.

Further, the electrostatic chuck 20A may have a source electrode to which the radio frequency power from the radio frequency power source 61 is supplied. The source electrode is provided in the dielectric portions 20d of at least one of the first region 21 and the second region 22. In a case where the source electrode is provided in the dielectric portion 20d of the first region 21, the source electrode may be provided below the first electrode 21c, and the first electrode 21c may be provided below the electrode 21a. Alternatively, the source electrode may be provided above the first electrode 21c and below the electrode 21a. In a case where the source electrode is provided in the dielectric portion 20d of the second region 22, the source electrode may be provided below the second electrode 22c, and the second electrode 22c may be provided below the electrodes 22a and 22b. Alternatively, the source electrode may be provided above the second electrode 22c and below the electrodes 22a and 22b.

While various exemplary embodiments have been described above, various additions, omissions, substitutions and changes may be made without being limited to the exemplary embodiments described above. Elements of the different embodiments may be combined to form another embodiment.

For example, each of the power source systems 70, 81, and 82 may have one or more power sources (for example, direct-current power sources) capable of outputting a pulse of a voltage (for example, a direct-current voltage), instead of the configurations shown in FIGS. 7 and 8. Each of the one or more power sources may be a variable direct-current power source. The bias voltages of various examples described above can be generated by such one or more power sources.

Further, the pulse controller PC may be a configuration associated with the radio frequency power source 61 or the radio frequency power source 62, instead of the configurations of the power source systems 70, 81, and 82.

Further, in the second example shown in FIG. 3, the second pulse PL2 may be generated by connecting the node 722 to the ground after the point in time of end of the first period P1, and electrically separating the node 722 from the direct-current power source 71 before the potential of the node 722 becomes 0 V. In order to connect the node 722 to the ground, the one or more switching transistors 72a are set to a closed state and the one or more switching transistors 72b are set to an open state. In order to electrically separate the node 722 from the direct-current power source 71, the one or more switching transistors 72a and the one or more switching transistors 72b are set to an open state.

Further, in another embodiment, the plasma processing apparatus may be another type of plasma processing apparatus, instead of the capacitively coupled plasma processing apparatus. The other type of plasma processing apparatus may be an inductively coupled plasma processing apparatus, an electron cyclotron resonance (ECR) plasma processing apparatus, or a plasma processing apparatus that generates plasma by using surface waves such as microwaves. In the plasma processing methods according to various exemplary embodiments, such other types of plasma processing apparatuses may be used.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a chamber;
a substrate support having an electrode and configured to support a substrate in the chamber; and
a DC power source system electrically connected to the electrode and configured to apply a bias voltage to the electrode to draw ions from a plasma in the chamber into the substrate on the substrate support,
wherein the power source system is configured to periodically output a first pulse to the electrode at a frequency of 100 kHz or more and 1 MHz or less in a first period and periodically output a second pulse to the electrode at a frequency of 100 kHz or more and 1 MHz or less in a second period after the first period, as the bias voltage,
each of the first pulse and the second pulse is a pulse of a negative voltage, and
a voltage level of the first pulse is different from a voltage level of the second pulse,
wherein
a controller is configured to control the power source system to output a single pulse of a positive voltage to the electrode before start of the first period within a subsequent cycle of two cycles, each of which includes the first period and the second period.

2. The plasma processing apparatus according to claim 1, wherein the second period is continuous with the first period,
each of the first pulse and the second pulse is a pulse of a negative voltage, and
an absolute value of the voltage level of the first pulse is smaller than an absolute value of the voltage level of the second pulse.

3. The plasma processing apparatus according to claim 1, wherein
an absolute value of the voltage level of the first pulse is larger than an absolute value of the voltage level of the second pulse.

4. The plasma processing apparatus according to claim 3, wherein the power source system is configured to periodically output the first pulse to the electrode in the first period to etch a silicon oxide film of a multilayer film in the first period and periodically output the second pulse to the electrode in the second period to etch a silicon nitride film of the multilayer film in the second period.

5. The plasma processing apparatus according to claim 1, wherein the second period is continuous with the first period,
each of the first pulse and the second pulse is a pulse of a negative voltage, and
an absolute value of the voltage level of the first pulse is larger than an absolute value of the voltage level of the second pulse.

6. The plasma processing apparatus according to claim 1, wherein the power source system is configured to periodically output the first pulse to the electrode in the first period to etch a film of the substrate in the first period and periodically output the second pulse to the electrode in the second period to etch the film of the substrate in the second period.

7. The plasma processing apparatus according to claim 1, wherein an absolute value of a voltage of one of the first pulse and the second pulse is 6 kV or more.

8. The plasma processing apparatus according to claim 1 wherein the power source system is further configured to output a single pulse of a positive voltage immediately before outputting the second pulse first in the second period.

9. The plasma processing apparatus according to claim 1 further comprising a radio frequency power source electrically connected to the substrate support and configured to supply a radio frequency power to generate a plasma in the chamber.

10. The plasma processing apparatus according to claim 1, wherein the power source system comprises:
a first direct current power source including a positive terminal connected to a ground, the direct current power source being a variable direct current power source;
a first circuit configured to generate the first pulse and the second pulse from a negative voltage output from a negative terminal of the first direct current power source;
a second direct current power source including a negative terminal connected to a ground; and
a second circuit configured to generate a single pulse from a positive voltage output from a positive terminal of the second direct current power source, wherein
the first circuit includes:
one or more first switching transistor connected in series between the positive terminal of the first direct current power source and a first node;
one or more second switching transistor connected in series between the negative electrode of the first direct current power source and the first node;
a first diode having a cathode connected to the positive terminal of the first direct current power source and an anode connected to a second node which is connected to the first node and the electrode of the substrate support; and
a second diode having a cathode connected to the second node and an anode connected to the negative terminal of the first direct current power source, and
the second circuit includes:
one or more third switching transistor connected in series between the positive terminal of the second direct current power source and a third node;
one or more fourth switching transistor connected in series between the negative electrode of the second direct current power source and the third node;
a third diode having a cathode connected to the positive terminal of the second direct current power source and an anode connected to a fourth node which is connected to the third node and the electrode of the substrate support; and
a fourth diode having a cathode connected to the fourth node and an anode connected to the negative terminal of the second direct current power source.

11. The plasma processing apparatus according to claim 1, wherein the power source system comprises:
a first direct current power source including a positive terminal connected to a ground;
a first circuit configured to generate the first pulse from a negative voltage output from a negative terminal of the first direct current power source;
a second direct current power source including a negative terminal connected to a ground;
a second circuit configured to generate a single pulse from a positive voltage output from a positive terminal of the second direct current power source;
a third direct current power source including a positive terminal connected to a ground; and
a third circuit configured to generate the second pulse from a negative voltage output from a negative terminal of the third direct current power source, wherein the first circuit includes:
  one or more first switching transistor connected in series between the positive terminal of the first direct current power source and a first node;
  one or more second switching transistor connected in series between the negative electrode of the first direct current power source and the first node;
  a first diode having a cathode connected to the positive terminal of the first direct current power source and an anode connected to a second node which is connected to the first node;
  a second diode having a cathode connected to the second node and an anode connected to the negative terminal of the first direct current power source; and
  an additional switching transistor connected between the second node and a common node, the common node being connected to the electrode of the substrate support,
the second circuit includes:
  one or more third switching transistor connected in series between the positive terminal of the second direct current power source and a third node;
  one or more fourth switching transistor connected in series between the negative electrode of the second direct current power source and the third node;
  a third diode having a cathode connected to the positive terminal of the second direct current power source and an anode connected to a fourth node which is connected to the third node and the electrode of the substrate support; and
  a fourth diode having a cathode connected to the fourth node and an anode connected to the negative terminal of the second direct current power source, and
the third circuit includes:
  one or more fifth switching transistor connected in series between the positive terminal of the third direct current power source and a fifth node;
  one or more sixth switching transistor connected in series between the negative electrode of the third direct current power source and the fifth first node;
  a fifth diode having a cathode connected to the positive terminal of the third direct current power source and an anode connected to a sixth node which is connected to the fifth node;
  a sixth diode having a cathode connected to the sixth node and an anode connected to the negative terminal of the third direct current power source; and
  an additional switching transistor connected between the sixth node and the common node.

12. A plasma processing apparatus comprising:
a chamber;
a substrate support having an electrode and configured to support a substrate in the chamber; and
a DC power source system electrically connected to the electrode and configured to apply a bias voltage to the electrode to draw ions from a plasma in the chamber into the substrate on the substrate support,
wherein the power source system is configured to periodically output a first pulse to the electrode at a frequency of 100 kHz or more and 1 MHz or less in a first period and periodically output a second pulse to the electrode at a frequency of 100 kHz or more and 1 MHz or less in a second period after the first period, as the bias voltage,
each of the first pulse and the second pulse is a pulse of a negative voltage,
a voltage level of the first pulse is different from a voltage level of the second pulse, and
a controller is configured to control the power source system to alternately output the first pulse and a pulse of a positive voltage to the electrode in the first period and alternately output the second pulse and a pulse of a positive voltage to the electrode in the second period.

13. A plasma processing method comprising:
preparing a substrate on a substrate support provided in a chamber of a plasma processing apparatus, wherein the substrate support includes an electrode;
periodically outputting a first pulse from a DC power source system to the electrode at a frequency of 100 kHz or more and 1 MHz or less in a first period as a bias voltage to draw ions from plasma in the chamber into the substrate; and
periodically outputting a second pulse as the bias voltage from the power source system to the electrode at a frequency of 100 kHz or more and 1 MHz or less in a second period,
wherein each of the first pulse and the second pulse is a pulse of a negative voltage, and
a voltage level of the first pulse is different from a voltage level of the second pulse, and
wherein the plasma processing method further comprises outputting a single pulse of a positive voltage to the electrode before start of the first period within a subsequent cycle of two cycles, each of which includes the first period and the second period.

* * * * *